United States Patent
Kim et al.

[11] Patent Number: 5,920,585
[45] Date of Patent: Jul. 6, 1999

[54] LASER DIODE PACKAGE HAVING AN OPTICAL POWER MONITORING FUNCTION

[75] Inventors: Il Kim; Chun-seong Park, both of Suwon, Rep. of Korea

[73] Assignee: Samsung Electronics Co., Ltd., Kyungki-do, Rep. of Korea

[21] Appl. No.: 08/837,456

[22] Filed: Apr. 18, 1997

[30] Foreign Application Priority Data

Apr. 18, 1996 [KR] Rep. of Korea ................. 96-11754

[51] Int. Cl.$^6$ ................. H01S 3/04; H01S 3/18
[52] U.S. Cl. ................. 372/43; 372/36
[58] Field of Search ................. 372/43, 36, 50; 257/81; 369/116, 54, 112, 110

[56] References Cited

U.S. PATENT DOCUMENTS

| | | | |
|---|---|---|---|
| 5,410,468 | 4/1995 | Horinouchi | 369/103 |
| 5,570,333 | 10/1996 | Katayama | 369/110 |
| 5,600,621 | 2/1997 | Noda et al. | 369/116 |

FOREIGN PATENT DOCUMENTS

| | | | |
|---|---|---|---|
| 62-196881 | 8/1987 | Japan | H01S 3/18 |
| 1-151285 | 6/1989 | Japan | H01S 3/18 |
| 1-256189 | 10/1989 | Japan | H01S 3/18 |
| 3-268241 | 11/1991 | Japan | G11B 7/135 |
| 4-199890 | 7/1992 | Japan | H01S 3/18 |
| 4-241234 | 8/1992 | Japan | G11B 7/135 |
| 6-309685 | 11/1994 | Japan | G11B 7/125 |

OTHER PUBLICATIONS

"Vertical–Cavity Surface–Emitting Lasers for Optical Data Storage" SHIN et al., Jpn. J. Appl. Phys. vol. 35 (1996) pp. 506–507, Part 1, No. 1B, Jan. 1996.

*Primary Examiner*—Rodney Bovernick
*Assistant Examiner*—Quyen Phan Leung
*Attorney, Agent, or Firm*—Sughrue, Mion, Zinn, Macpeak & Seas

[57] ABSTRACT

A laser diode package having an optical power monitoring function includes a monitor diode for monitoring an optical power of the light emitted from a laser diode. In the laser diode package, an optical member has a projection window for advancing the light emitted from the laser diode to a desired direction and a reflection surface from which the light emitted from the laser diode is reflected. The monitor diode receives the light reflected from the reflection surface of the optical member in order to monitor an optical power of the light emitted from the laser diode. A slot is installed on an area except for an optical path which is formed by the light projected via the projection window of the optical member, for shielding ambient light. Thus, the laser diode package having an optical power monitoring function prevents a mix-operation of the monitor diode due to the ambient light.

4 Claims, 1 Drawing Sheet

LASER DIODE PACKAGE HAVING AN OPTICAL POWER MONITORING FUNCTION

BACKGROUND OF THE INVENTION

The present invention relates to a laser diode package having a monitor diode for monitoring an optical power of a laser diode, and more particularly, to a laser diode package having an optical power monitoring function for shielding ambient light which can induce a misoperation of a monitor diode.

A conventional optical disc system, such as a compact disc player, projects laser light onto the recording surface of a disc and reads information recorded on the disc. In such an optical disc system, if an output of the laser light varies, an error may be generated when a signal is read from the disc. Thus, the optical disc system includes an automatic laser power control (ALPC) to stably control the output of the laser light.

A semiconductor laser diode used as a light source in a compact disc player has a poor temperature characteristic. As the temperature rises, the optical power decreases, while as the temperature falls, the optical power increases. The ALPC circuit in the conventional optical disc system uses a photodiode to monitor the optical power of such a laser diode, and controls a driving current of the laser diode according to the current flowing through the photodiode.

FIG. 1 shows the structure of a conventional laser diode package. The laser diode package 100 of FIG. 1 includes a laser diode 11, a monitor diode 12 for monitoring an optical power of the laser diode 11 and a signal detection diode 13 for detecting information recorded on a disc 17. The laser diode 11, the monitor diode 12 and the signal detection diode 13 are mounted on a lead frame base 10. Most of the light emitted from the laser diode 11 passes through a transparent plate 15 and then is incident to an objective lens 16. Part of the light emitted from the laser diode 11 is reflected from a surface 18 of the transparent plate 15 and then is incident to the monitor diode 12. The light incident to the objective lens 16 is focussed at a point on the disc 17 by the objective lens 16. The light reflected from the disc 17 enters into the laser diode package 100 via the objective lens 16.

The transparent plate 15 of the laser diode package 100 has a structure in which a holographic optical element 14 is installed on or near the surface facing the objective lens 16, and is fabricated by injection molding. The holographic optical element 14 of the transparent plate 15 diffracts the light incident from the objective lens 16 and the light diffracted by the holographic optical element 14 is incident to the signal detection diode 13.

The monitor diode 12 outputs a monitor current to an ALPC circuit (not shown). The monitor current is proportional to the quantity of the incident light. The well-known ALPC circuit adjusts the driving current of the laser diode 11 uniformly according to the monitor current output from the monitor diode 12.

When the disc 17 wobbles or ambient light "a" is incident to the monitor diode 12, the monitor diode 12 monitors the ambient light "a" as well as the quantity of the light incident from the laser diode 11 so that more than the actual quantity of light incident from the laser diode 11 is recognized, thus the improper monitor current is output to the ALPC.

SUMMARY OF THE INVENTION

To solve the above problem, it is an object of the present invention to provide a laser diode package having an optical power monitoring function for shielding ambient light which can accurately monitor an optical power of a laser diode.

To accomplish the above object of the present invention, there is provided a laser diode package having an optical power monitoring function comprising: a laser diode; an optical member having a projection window for advancing the light emitted from the laser diode to a desired direction and a reflection surface from which the light emitted from the laser diode is reflected; a monitor diode for receiving the light reflected from the reflection surface of the optical member in order to monitor an optical power of the light emitted from the laser diode; and means for shielding ambient light which is installed on an area of the optical member except for an optical path which is formed by the light projected via the projection window.

BRIEF DESCRIPTION OF THE DRAWINGS

The preferred embodiments are described with reference to the drawings wherein.

DETAILED DESCRIPTION OF PREFERRED EMBODIMENT

A preferred embodiment of the present invention will be described in detail with reference to the accompanying drawings.

Figure 1:
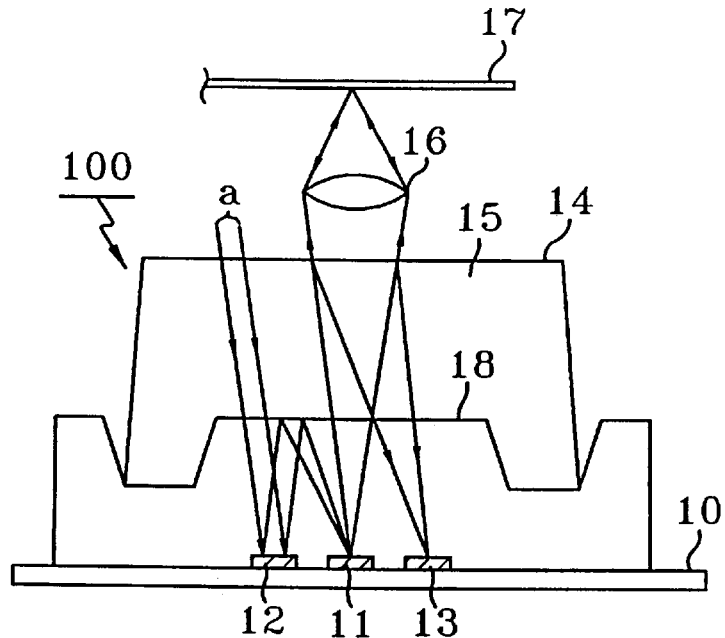
FIG. 1 is a view showing the structure of a conventional laser diode package.
Figure 2:
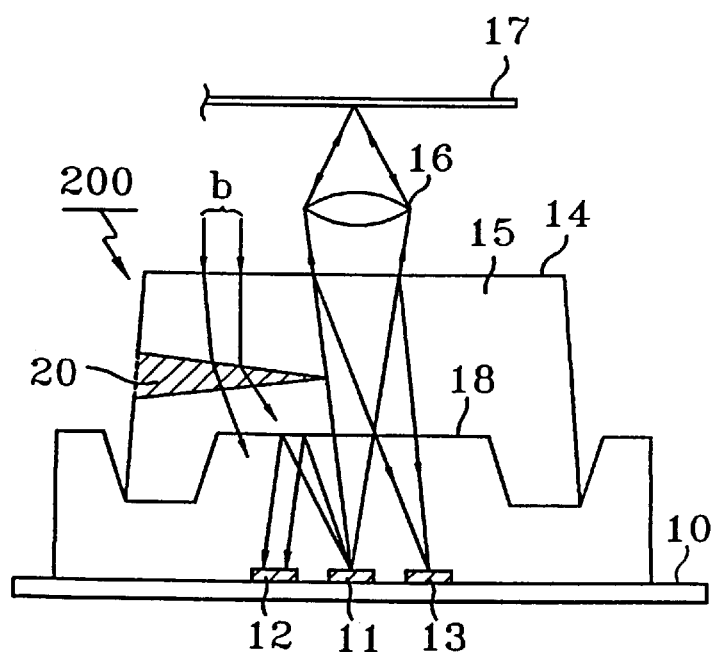
FIG. 2 is a view showing the structure of a laser diode package according to the present invention.

FIG. 2 shows the structure of a laser diode package 200 according to the present invention. The elements having the same reference numerals as those of FIG. 1 have the same functions as those of FIG. 1. The laser diode package 200 includes a slot 20 having an optical characteristic for scattering incident light. The slot 20 has a size and a shape by which portions, except for an optical path where the light emitted from the laser diode 11 is incident on the objective lens 16, can be shielded.

In the laser diode package 200 having the above structure, ambient light "b" passes through the slot 20 and simultaneously scatters. Therefore, the ambient light "b" incident to the monitor diode 12 is extremely small in intensity. That is, the ambient light has such a small magnitude that the total magnitude of the monitor current is not changed. Therefore, only the light of the laser diode 11 reflected from the surface 18 of the transparent plate 15 is substantially incident to the monitor diode 12. Thus, the monitor diode 12 outputs the monitor current proportional to an optical power of the laser diode 11. Also, the surface of the slot 20 in the transparent plate 15 is processed to be gross to shield ambient light.

As described above, the laser diode package having an optical power monitoring function according to the present invention prevents the monitor diode from misreading the quantity of the optical power of the laser diode due to the ambient light.

While only certain embodiments of the invention have been specifically described herein, it will apparent that numerous modifications may be made thereto without departing from the spirit and scope of the invention.

What is claimed is:

1. A laser diode package having an optical power monitoring function comprising:

a laser diode;

an optical member having a projection window for advancing a light emitted from said laser diode to a desired direction and a reflection surface from which the light emitted from said laser diode is reflected;

a monitor diode for receiving the light reflected from the reflection surface of said optical member for monitoring an optical power of the light emitted from said laser diode; and means for shielding said monitor diode from ambient light wherein said shield means is positioned on an area of said optical member to not block an optical path which is formed by the light projected from the laser diode via the projection window.

2. The laser diode package having an optical power monitoring function according to claim 1, wherein said shield means scatters the ambient light.

3. The laser diode package having an optical power monitoring function according to claim 1, wherein said shield means is processed to be gross on the surface for shielding the ambient light.

4. The laser diode package having an optical power monitoring function according to claim 1, wherein said shield means is a slot formed on said optical member.

\* \* \* \* \*